United States Patent
Pu et al.

(10) Patent No.: US 6,451,625 B1
(45) Date of Patent: Sep. 17, 2002

(54) METHOD OF FABRICATING A FLIP-CHIP BALL-GRID-ARRAY PACKAGE WITH MOLDED UNDERFILL

(75) Inventors: Han-Ping Pu, Taipei (TW); Tzong-Da Ho, Taichung (TW)

(73) Assignee: Siliconware Precision Industries, Co., Ltd. (TW)

(*) Notice: Subject to any disclaimer, the term of this patent is extended or adjusted under 35 U.S.C. 154(b) by 0 days.

(21) Appl. No.: 09/760,440

(22) Filed: Jan. 13, 2001

(51) Int. Cl.$^7$ .................. H01L 21/44; H01L 21/48; H01L 21/50
(52) U.S. Cl. .............. 438/108; 438/121; 438/124; 438/125; 438/126; 438/127
(58) Field of Search ................ 438/108, 121, 438/124–127

(56) References Cited

U.S. PATENT DOCUMENTS 5,710,071 A * 1/1998 Beddingfield et al. ...... 438/108
6,038,136 A * 3/2000 Weber ...................... 361/783

* cited by examiner

*Primary Examiner*—David L. Talbott
*Assistant Examiner*—David A. Zarneke
(74) *Attorney, Agent, or Firm*—Peter F. Corless; Steven M. Jensen; Edwards & Angell, LLP

(57) ABSTRACT

A method of fabricating a FCBGA (Flip-Chip Bal-Grid-Array) package with molded underfill is proposed, which is characterized by the forming of a mold-buffering opening in the solder mask at the exit of the vent hole in the substrate, wherein the mold-buffering opening is dimensioned to be greater in width than the inside diameter of the vent hole, so that during molding process when the encapsulation material infiltrates to the exit of the vent hole, it can be confined within the mold-buffering opening, thereby preventing it from flashing to nearby solder-ball pads. Since there would substantially exist no mold flash over the exposed surface of the solder mask and the solder-ball pads, the resulted FCBGA package would be assured in the quality of its outer appearance and the bonding between the solder-ball pads and the subsequently attached solder balls thereon.

9 Claims, 5 Drawing Sheets

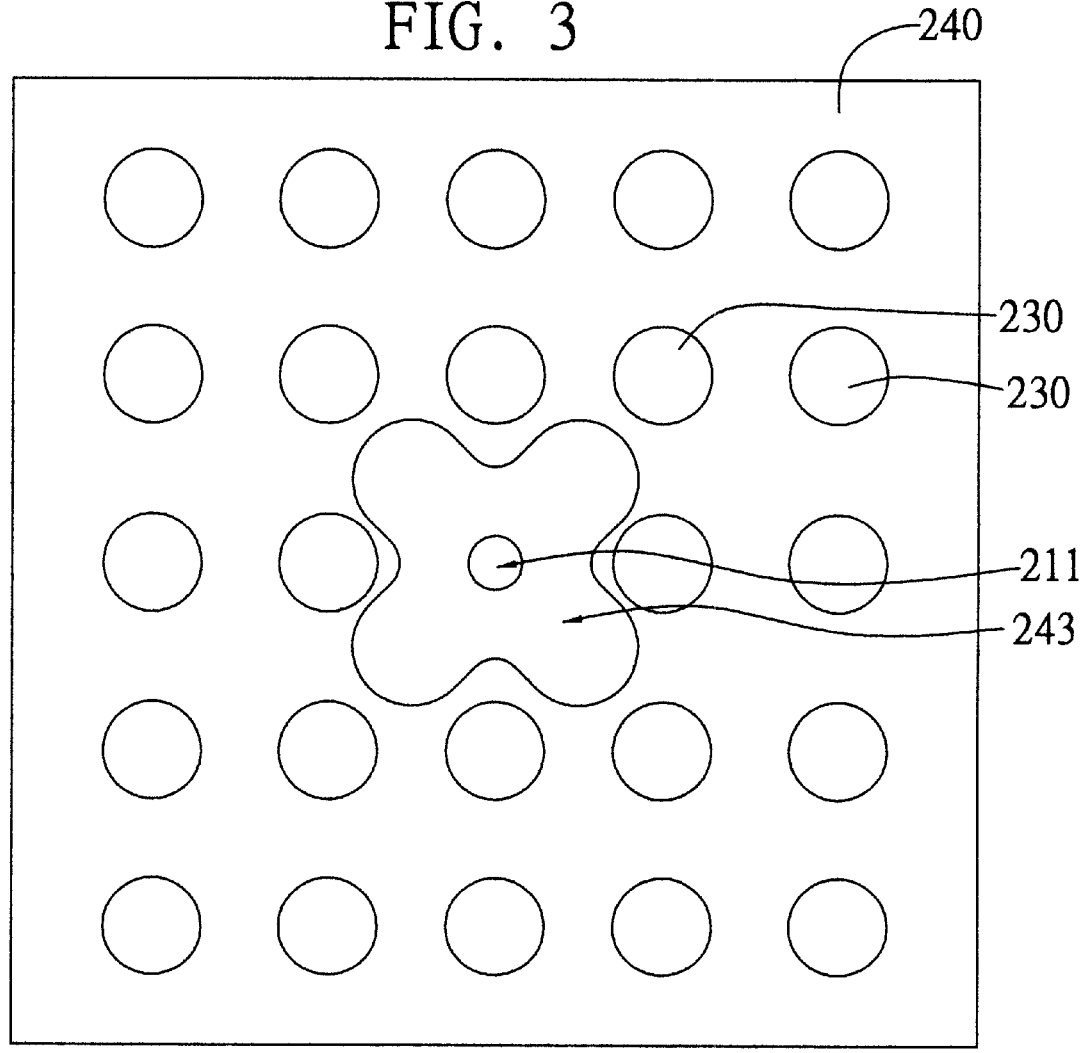

METHOD OF FABRICATING A FLIP-CHIP BALL-GRID-ARRAY PACKAGE WITH MOLDED UNDERFILL

BACKGROUND OF THE INVENTION

1. Field of the Invention

This invention relates to integrated circuit packaging technology, and more particularly, to a method of fabricating a FCBGA (Flip-Chip Ball-Grid-Array) package with molded underfill.

2. Description of Related Art

BGA (Ball Grid Array) is an advanced type of integrated circuit packaging technology which is characterized by the use of a substrate whose front side is mounted with a semiconductor chip and whose back side is mounted with a grid array of solder balls. During SMT (Surface Mount Technology) process, the BGA package can be mechanically bonded and electrically coupled to a printed circuit board (PCB) by means of these solder balls.

FCBGA (Flip-Chip Ball-Grid-Array) is a more advanced type of BGA technology which is characterized by that the semiconductor chip is mounted in an upside-down (i.e., clip chip) manner over the substrate and bonded to the same by means of a plurality of solder bumps attached to the I/O pads thereon.

As the flip chip is readily bonded in position over the substrate, however, an undergap would be undesirably left between the flip chip and the substrate. If this flip-chip undergap is not underfilled, it would easily cause the flip chip to suffer from fatigue cracking and electrical failure due to thermal stress when the entire package structure is being subjected to high-temperature conditions. As a solution to this problem, it is an essential step in flip-chip package fabrication to fill up the flip-chip undergap with an electrically-insulative material into the flip-chip undergap. The underfilled material, when hardened, can serve as a mechanical reinforcement for the flip chip to cope against thermal stress.

Conventionally, there are many methods that can be used to perform the above-mentioned flip-chip underfill process. One method is the molded-underfill process, which can fill the flip-chip undergap incidentally through the molding process to fabricate the required encapsulation body (or called molded compound). One example of the molded-underfill process is depicted in the following with reference to FIGS. 1A–1D (note that FIGS. 1A–1D are simplified schematic diagrams showing only the parts related to the invention; the actual layout on the FCBGA package may be much more complex).

FIG. 1A is a schematic sectional diagram showing a semi-finished FCBGA package assembly before molding; and FIG. 1B shows a bottom view of the semi-finished FCBGA package assembly of FIG. 1A. As shown, the semi-finished FCBGA package assembly includes: (a) a substrate 110 having a front surface 110a and a back surface 110b; (b) a semiconductor chip 120 mounted in an upside-down (i.e., flip chip) manner by means of a plurality of solder bumps 121 over the front surface 110a of the substrate 110; (c) an array of solder-ball pads 130 formed over the back surface 110b of the substrate 110, which are used for subsequent attachment of an array of solder balls (not shown) thereon; and (d) a solder mask 140 which is pre-defined with a plurality of openings 141 to expose the solder-ball pads 130.

As the semiconductor chip 120 is readily mounted in position over the substrate 110, however, a flip-chip undergap 120a would be undesirably left between the semiconductor chip 120 and the substrate 110. If this flip-chip undergap 120a is riot underfilled, it would easily cause the semiconductor chip 120 to suffer from fatigue cracking and electrical failure due to thermal stress when the entire package structure is being subjected to high-temperature conditions. One solution to this problem is to perform a molded-underfill process.

To facilitate the molded-underfill process, it is required to drill a vent hole 111 through the substrate 110 and the solder mask 140 at the central point of the area where the semiconductor chip 120 is mounted. Conventionally, the vent hole 111 is formed by drilling through the vent hole 111 and the solder mask 140, so that the part of the vent hole 111 in the solder mask 140 is equal in inside diameter as the part in the substrate 110.

Referring further to FIG. 1C together with FIG. 1D, during the molding process, the semi-finished FCBGA package assembly is disposed in a molding tool (not shown), and an encapsulation material, such as epoxy resin, is injected into the molding tool (not shown) to form an encapsulation body 150 to encapsulate the semiconductor chip 120.

During the forgoing molding process, the encapsulation material will also infiltrate into the flip-chip undergap 120a. Owing to the provision of the vent hole 111, the air in the flip-chip undergap 120a can escape to the outside atmosphere, thus allowing the encapsulation material to infiltrate unresistingly into the entire flip-chip undergap 120a and thereby form a molded underfill layer 122 between the semiconductor chip 120 and the substrate 110.

One problem to the foregoing molded-underfill process, however, is that the encapsulation material would further infiltrate all the way through the vent hole 111 to the bottom side of the solder mask 140 (the marching path is indicated by the arrows in FIG. 1C), and thus flash over the exposed surface of the solder mask 140 and possibly over the nearby solder-ball pads 130. Since the encapsulation material is electrically-insulative, the mold flash over the solder-ball pads 130 would degrade the bonding between the solder-ball pads 130 and the subsequently attached solder balls (not shown) thereon.

Related patents, include, for example, the U.S. Pat. No. 6,038,136 entitled "CHIP PACKAGE WITH MOLDED UNDERFILL". This patent discloses a FCBGA package that is underfilled through molded-underfill process. The utilization of this patent, however, still has the above-mentioned problem of mold flash.

SUMMARY OF THE INVENTION

It is therefore an objective of this invention to provide a method for fabricating a FCBGA package with molded underfill, which can help to prevent mold flash over exposed surface of the resulted package through the vent hole, so as to assure the quality of the outer appearance of the resulted package.

It is another objective of this invention to provide a method for fabricating a FCBGA package with molded underfill, which can help to prevent mold flash over exposed surface of the resulted package, so as to assure the quality of the bonding between the solder-ball pads and the solder balls attached thereon.

In accordance with the foregoing and other objectives, the invention proposes an improved method for fabricating a FCBGA package with molded underfill.

Broadly recited, the method of the invention comprises the following steps: (1) preparing a substrate having a front surface and a back surface; the substrate being formed with a vent hole at a predefined location; the vent hole having an exit in the back surface of the substrate, (2) forming a plurality of solder-ball pads over the back surface of the substrate; (3) forming a solder mask over the back surface of the substrate; wherein the solder mask is predefined with an array of pad openings to expose the solder-ball pads and a mold-buffering opening aligned to the vent hole; and wherein the mold-buffering opening is dimensioned to be greater in width than the inside diameter of the vent hole; (4) mounting a flip chip over the front surface of the substrate; wherein a flip-chip undergap is left between the flip chip and the substrate; and (5) performing a molding process to form an encapsulation body through the injection of a encapsulation material to encapsulate the flip chip; wherein the vent hole allows the air in the flip-chip undergap to escape to the outside atmosphere, thereby allowing the encapsulation material to infiltrate unresistingly into the flip-chip undergap and form a molded-underfill layer; and wherein as the encapsulation material flows to the exit of the vent hole, the encapsulation material is contained with the solder mask's mold-buffering opening.

By the invention, there would substantially exist no mold flash over the exposed surface of the solder mask and the solder-ball pads; and therefore, the resulted FCBGA package would be assured in the quality of its outer appearance and the bonding effect between the solder-ball pads and the subsequently attached solder balls thereon.

BRIEF DESCRIPTION OF DRAWINGS

The invention can be more fully understood by reading the following detailed description of the preferred embodiments, with reference made to the accompanying drawings, wherein:

FIG. 3 shows another embodiment of the invention.

DETAILED DESCRIPTION OF PREFERRED EMBODIMENTS

The method according to the invention for fabricating a FCBGA package with molded underfill is disclosed in full details by way of preferred embodiments in the following with reference to FIGS. 2A–2D and FIG. 3.

Figure 1A:
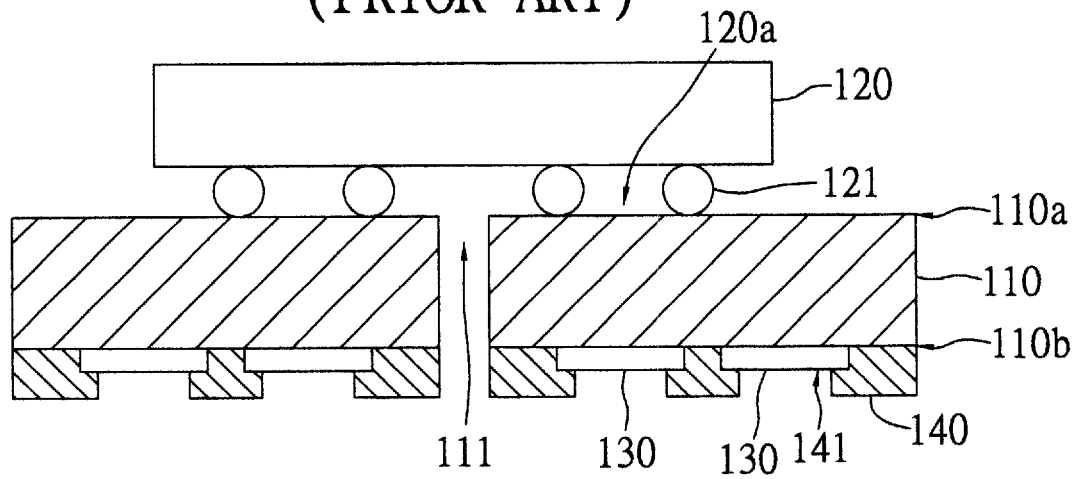
FIG. 1A (PRIOR ART) is a schematic sectional diagram showing a semi-finished FCBGA package assembly before molding.
Figure 1B:
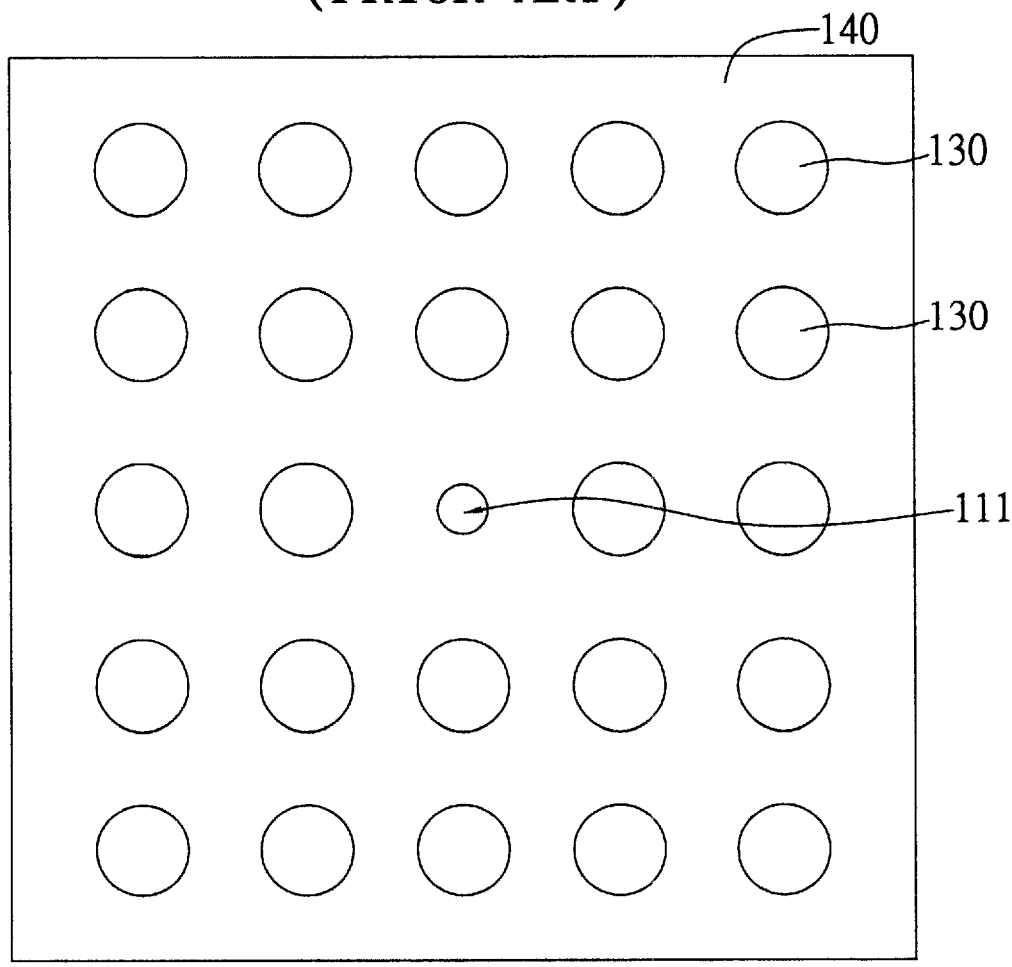
FIG. 1B (PRIOR ART) shows a bottom view of the semi-finished FCBGA package assembly of FIG. 1A.
Figure 1C:
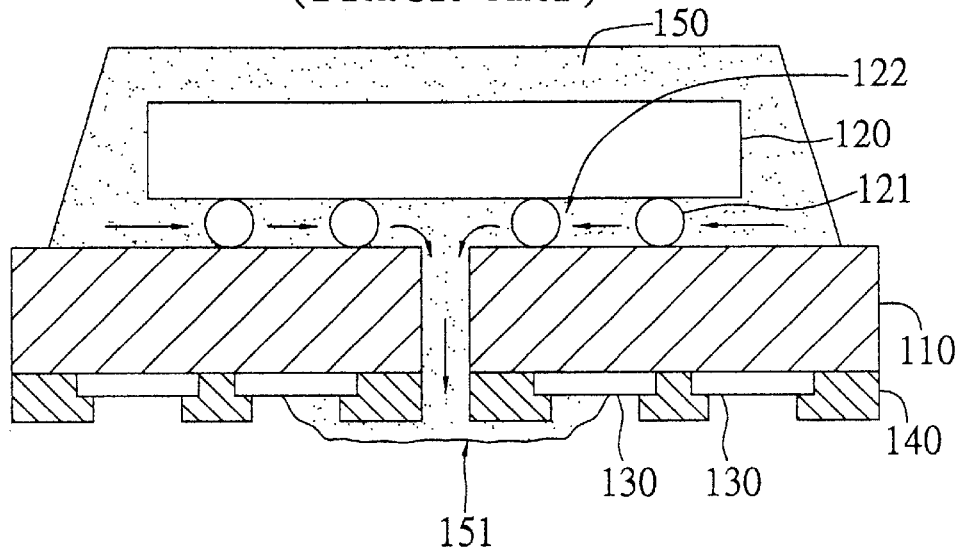
FIG. 1C (PRIOR ART) is a schematic sectional diagram showing the semi-finished FCBGA package assembly of FIG. 1A after molding.
Figure 1D:
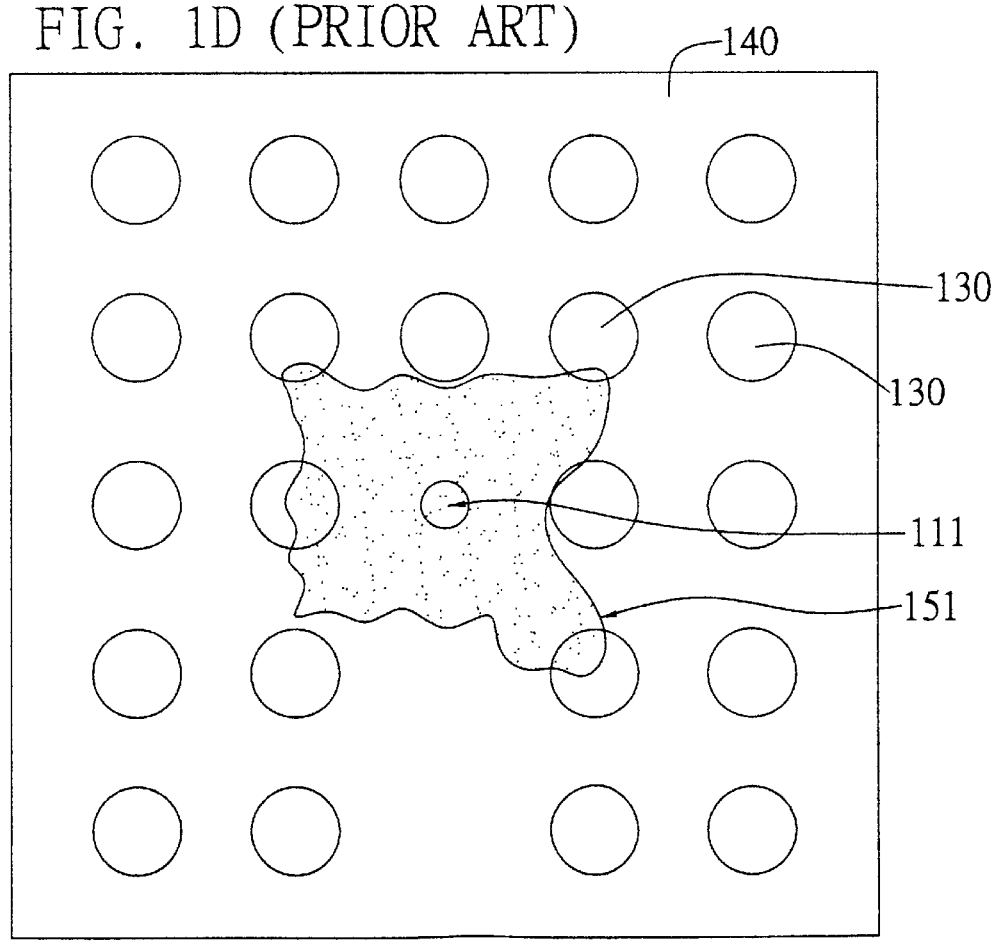
FIG. 1D (PRIOR ART) shows a bottom view of the molded FCBGA package assembly of FIG. 1C.
Figure 2A:
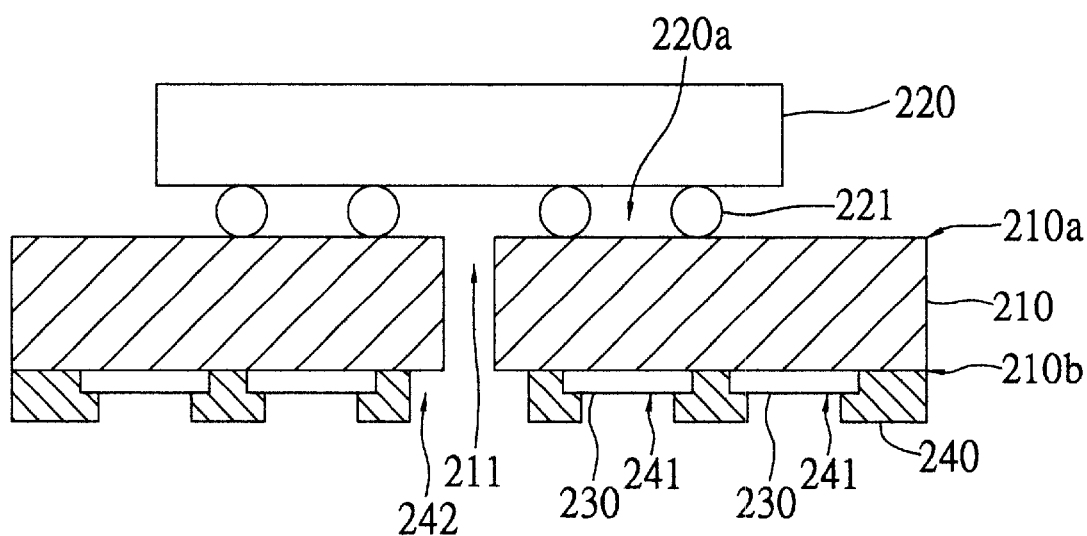
FIG. 2A is a schematic sectional diagram showing a semi-finished FCBGA package assembly configured according to the invention before molding.
Figure 2B:
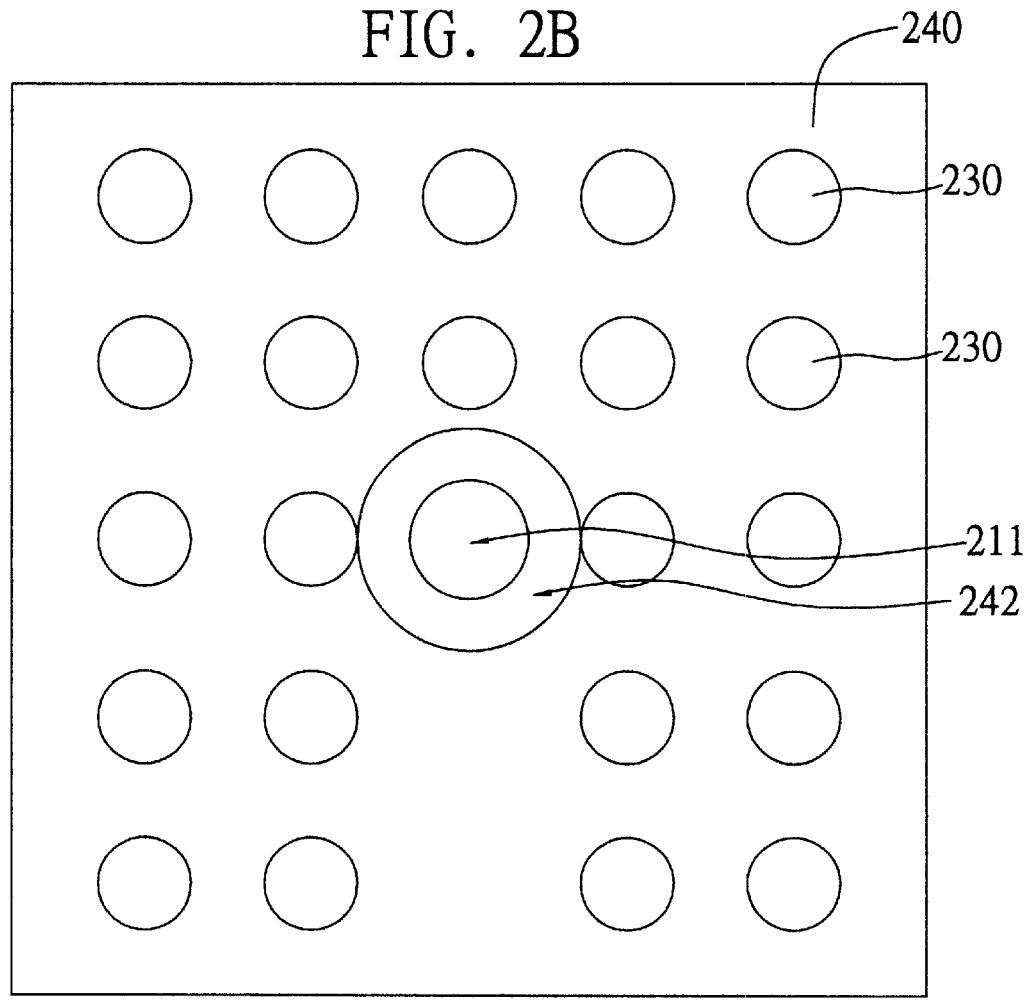
FIG. 2B shows a bottom view of the semi-finished FCBGA package assembly of FIG. 2A.

FIG. 2A is a schematic sectional diagram showing a semi-finished FCBGA package assembly before molding; and FIG. 2B shows a bottom view of the semi-finished FCBGA package assembly of FIG. 2A. As shown, the semi-finished FCBGA package assembly includes: (a) a substrate 210 having a front surface 210a and a back surface 210b; (b) a semiconductor chip 220 mounted in an upside-down (i.e., flip chip) manner by means of a plurality of solder bumps 221 over the front surface 210a of the substrate 210; (c) an array of solder-ball pads 230 formed over the back surface 210b of the substrate 210, which are used for subsequent attachment of an array of solder balls (not shown) thereon; and (d) a solder mask 240 which is predefined with a plurality of pad openings 241 to expose the solder-ball pads 230.

As the semiconductor chip 220 is readily mounted in position over the substrate 210, however, a flip-chip undergap 220a would be undesirably left between the semiconductor chip 220 and the substrate 210. To facilitate molded underfill to the flip-chip undergap 220a, a vent hole 211 is drilled through the substrate 210 at the central point of the area where the semiconductor chip 220 is mounted.

It is a characteristic feature of the invention that the solder mask 240 is formed with a mold-buffering opening 242 at the exit of the vent hole 211, and the mold-buffering opening 242 is dimensioned to be sufficiently greater in width than the inside diameter of the vent hole 211 in the substrate 210, preferably to a height of 50 μm (micrometer) and a width of from 0.3 mm to 1.0 mm (millimeter). In the embodiment of FIG. 2D, the mold-buffering opening 242 is circularly shaped.

FIG. 3 shows another embodiment of the invention, in which the mold-buffering opening (here designated by the reference numeral 243) is substantially cross-shaped. Compared to the embodiment of FIG. 2D, the mold-buffering opening 243 has a greater area that can provide an increased level of mold-buffering effect to the encapsulation material.

Figure 2C:
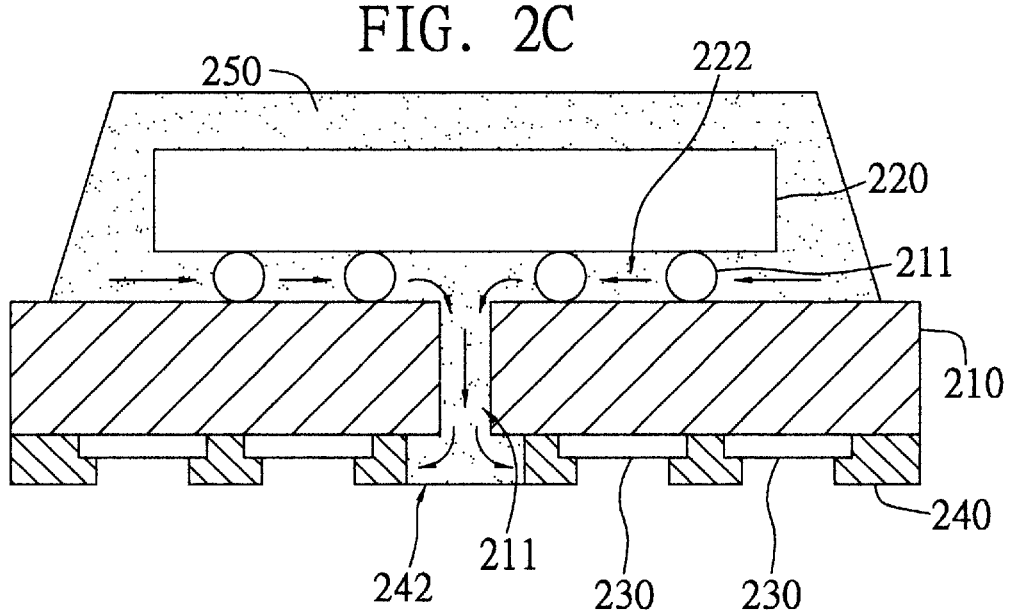
FIG. 2C is a schematic sectional diagram showing the semi-finished FCBGA package assembly of FIG. 2A after molding.
Figure 2D:
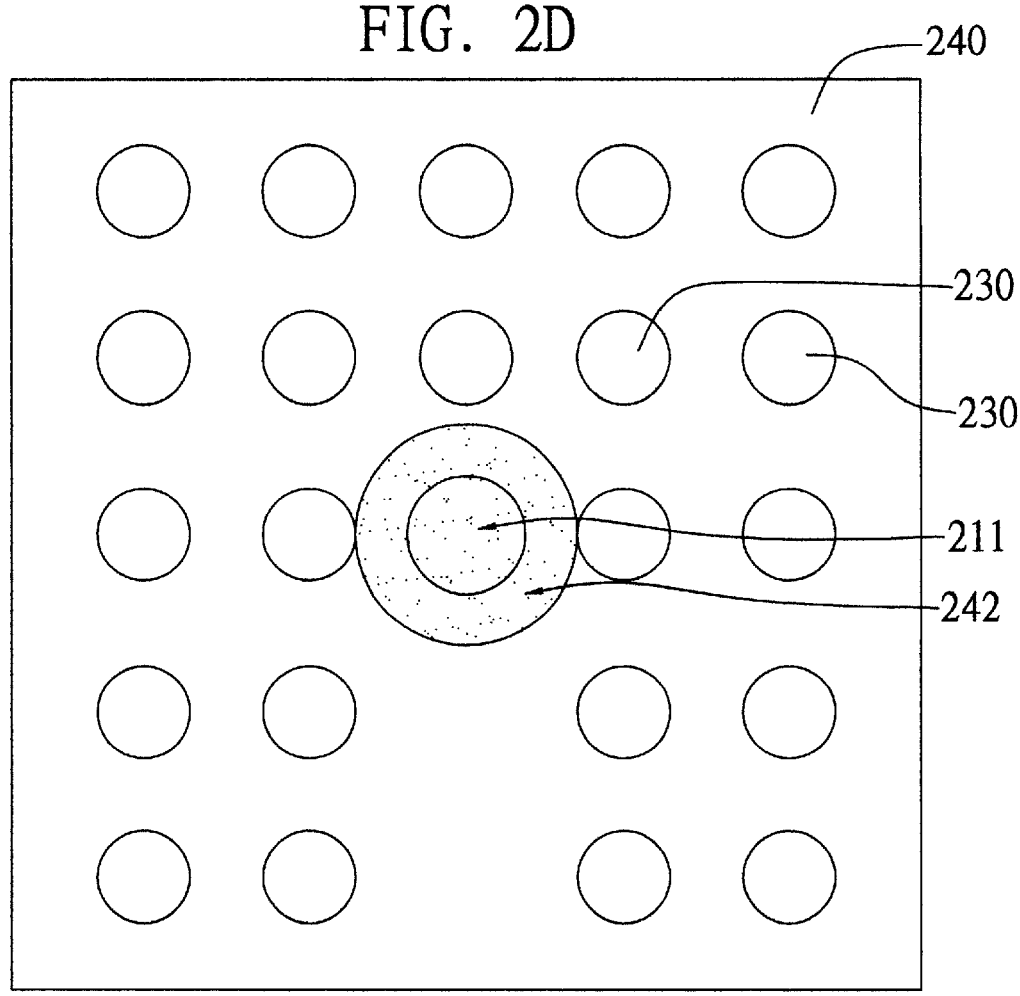
FIG. 2D shows a bottom view of the molded FCBGA package assembly of FIG. 2C.

Referring further to FIG. 2C and FIG. 2D, during the molding process, the semi-finished FCBGA package assembly is disposed in a molding tool (not shown), and a encapsulation material, such as epoxy resin, is injected into the molding tool (not shown) to form an encapsulation body 250 to encapsulate the semiconductor chip 220.

During the forgoing molding process, the encapsulation material will also infiltrate into the flip-chip undergap 220a. Owing to the provision of the vent hole 211, the air in the flip-chip undergap 220a can escape to the outside atmosphere, thus allowing the encapsulation material to infiltrate unresistingly into the entire flip-chip undergap 220a and thereby form a molded underfill layer 222 between the semiconductor chip 220 and the substrate 210.

As the encapsulation material further infiltrate all the way through the vent hole 211 to the mold-buffering opening 242 of the solder mask 240 (the marching path is indicated by the arrows in FIG. 2C), it would be significantly slowed in flow speed and increased in viscosity, and therefore confined within the mold-buffering opening 242 and would hardly flash to the nearby solder-ball pads 230.

As the molding process is completed, it can be seen that no mold flash would exist over the exposed surface of the solder mask 240 and the solder-ball pads 230. Therefore, the resulted FCBGA package would be assured in the quality of its outer appearance and the bonding between the solder-ball pads 230 and the subsequently attached solder balls (not shown) thereon.

Conclusion

In conclusion, the invention provides a method for fabricating a FCBGA package with molded underfill, which is characterized by the forming of a mold-buffering opening in the solder mask at the exit of the vent hole in the substrate, wherein the mold-buffering opening is dimensioned to be greater in width than the inside diameter of the vent hole, so that during molding process when the encapsulation material flows to the exit of the vent hole, it can be confined within the mold-buffering opening, thereby preventing it from flashing to nearby solder-ball pads. Compared to the prior art, the invention allows the resulted FCBGA package to be assured in the quality of its outer appearance and the bonding between the solder-ball pads and the subsequently attached solder balls thereon.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a FCBGA package, comprising the steps of:
   (1) preparing a substrate having a front surface and a back surface; the substrate being formed with a vent hole at a predefined location, the vent hole having an entrance in the front surface and an exit in the back surface of the substrate;
   (2) forming a plurality of solder-ball pads over the back surface of the substrate;
   (3) forming a solder mask over the back surface of the substrate;
      wherein the solder mask is predefined with an array of pad openings to expose the solder-ball pads and a mold-buffering opening aligned to the vent hole;
      and wherein the mold-buffering opening is dimensioned to be greater in width than the inside diameter of the vent hole;
   (4) mounting a flip chip over the front surface of the substrate; wherein a flip-chip undergap is left between the flip chip and the substrate; and
   (5) performing a molding process to form an encapsulation body through the injection of a encapsulation material to encapsulate the flip chip;
      wherein the vent hole allows the air in the flip-chip undergap to escape to the outside atmosphere, thereby allowing the encapsulation material to infiltrate unresistingly into the flip-chip undergap and form a molded-underfill layer;
      and wherein as the encapsulation material flows to the exit of the vent hole, the encapsulation material is contained with the solder mask's mold-buffering opening.

2. The method of claim 1, wherein the mold-buffering opening is dimensioned to a height of 50 $\mu$m and a width of from 0.3 mm to 1.0 mm.

3. The method of claim 1, wherein the mold-buffering opening in the solder mask is circularly-shaped.

4. The method of claim 1, wherein the mold-buffering opening in the solder mask is substantially cross-shaped.

5. The method of claim 1, wherein the encapsulation material is epoxy resin.

6. A method for fabricating a FCBGA package, comprising the steps of:
   (1) preparing a substrate having a front surface and a back surface the substrate being formed with a vent hole at a predefined location; the vent hole having an entrance in the front surface and an exit in the back surface of the substrate;
   (2) forming a plurality of solder-ball pads over the back surface of the substrate;
   (3) forming a solder mask over the back surface of the substrate;
      wherein the solder mask is predefined with an array of pad openings to expose the solder-ball pads and a mold-buffering opening aligned to the vent hole;
      and wherein the mold-buffering opening is dimensioned to a height of 50 $\mu$m and a width of from 0.3 mm to 1.0 mm greater than the inside diameter of the vent hole;
   (4) mounting a flip chip over the front surface of the substrate, wherein a flip-chip undergap is left between the flip chip and the substrate; and
   (5) performing a molding process to form an encapsulation body through the injection of a encapsulation material to encapsulate the flip chip;
      wherein the vent hole allows the air in the flip-chip undergap to escape to the outside atmosphere, thereby allowing the encapsulation material to infiltrate unresistingly into the flip-chip undergap and form a molded-underfill layer;
      and wherein as the encapsulation material flows to the exit of the vent hole, the encapsulation material is contained with the solder mask's mold-buffering opening.

7. The method of claim 6, wherein the mold-buffering opening in the solder mask is circularly-shaped.

8. The method of claim 6, wherein the mold-buffering opening in the solder mask is substantially cross-shaped.

9. The method of claim 6, wherein the encapsulation material is epoxy resin.

* * * * *